United States Patent
Kondoh et al.

(10) Patent No.: US 10,777,731 B2
(45) Date of Patent: Sep. 15, 2020

(54) ELEMENT AND ELECTRIC POWER GENERATOR

(71) Applicant: RICOH COMPANY, LTD., Tokyo (JP)

(72) Inventors: Tsuneaki Kondoh, Kanagawa (JP);
Junichiro Natori, Kanagawa (JP);
Tomoaki Sugawara, Kanagawa (JP);
Yuko Arizumi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 688 days.

(21) Appl. No.: 15/524,021

(22) PCT Filed: Oct. 27, 2015

(86) PCT No.: PCT/JP2015/005409
§ 371 (c)(1),
(2) Date: May 3, 2017

(87) PCT Pub. No.: WO2016/075882
PCT Pub. Date: May 19, 2016

(65) Prior Publication Data
US 2017/0324023 A1    Nov. 9, 2017

(30) Foreign Application Priority Data

Nov. 13, 2014  (JP) .................................. 2014-230538
Sep. 10, 2015  (JP) .................................. 2015-178644

(51) Int. Cl.
*H01L 41/047*   (2006.01)
*H01L 41/113*   (2006.01)
(Continued)

(52) U.S. Cl.
CPC .......... *H01L 41/113* (2013.01); *H01L 41/047* (2013.01); *H01L 41/193* (2013.01); *H01L 41/253* (2013.01); *H02N 2/00* (2013.01)

(58) Field of Classification Search
CPC ... H01L 41/113; H01L 41/047; H01L 41/193; H01L 41/253; H02N 2/00
(Continued)

(56) References Cited

U.S. PATENT DOCUMENTS

| 4,809,244 A * | 2/1989 | Penneck .............. G10K 11/008 367/162 |
| 2012/0068572 A1* | 3/2012 | Jenninger .............. H01L 41/193 310/300 |

(Continued)

FOREIGN PATENT DOCUMENTS

| EP | 1919072 A1 | 5/2008 |
| JP | 3-265477 A | 11/1991 |

(Continued)

OTHER PUBLICATIONS

European search report dated Nov. 3, 2017 in connection with corresponding European patent application No. 15859307.9.

(Continued)

*Primary Examiner* — Thomas M Dougherty
(74) *Attorney, Agent, or Firm* — Oblon, McClelland, Maier & Neustadt, L.L.P.

(57) ABSTRACT

An element, including a first electrode, an intermediate layer, and a second electrode, the first electrode, the intermediate layer, and the second electrode being laminated in this order, wherein the intermediate layer has flexibility, and wherein a deformation amount on a side of the first electrode of the intermediate layer is different from a deformation amount on a side of the second electrode of the intermediate layer when a pressure is applied to the intermediate layer in a direction orthogonal to a surface of the intermediate layer.

19 Claims, 2 Drawing Sheets

(51) Int. Cl.
*H01L 41/193* (2006.01)
*H01L 41/253* (2013.01)
*H02N 2/00* (2006.01)

(58) Field of Classification Search
USPC .................. 310/307, 309, 311–371, 800
See application file for complete search history.

(56) References Cited

U.S. PATENT DOCUMENTS

| | | | |
|---|---|---|---|
| 2013/0014823 | A1 | 1/2013 | Ko |
| 2013/0307371 | A1 | 11/2013 | Sakashita |
| 2013/0322942 | A1* | 12/2013 | Kondoh ............ G03G 15/2057 399/333 |
| 2015/0252821 | A1 | 9/2015 | Sugawara et al. |
| 2015/0380636 | A1* | 12/2015 | Fujisawa ................. C08K 3/22 524/783 |
| 2017/0207729 | A1* | 7/2017 | Kondoh .................... F03G 5/00 |
| 2017/0214338 | A1* | 7/2017 | Otagiri .................... H02N 1/04 |
| 2018/0145244 | A1* | 5/2018 | Otagiri .................... G01L 5/226 |
| 2019/0030732 | A1* | 1/2019 | Kondoh .................... G01L 5/00 |
| 2019/0061179 | A1* | 2/2019 | Natori ..................... B25J 19/06 |
| 2019/0103548 | A1* | 4/2019 | Sugawara ............. H01L 41/113 |

FOREIGN PATENT DOCUMENTS

| | | |
|---|---|---|
| JP | 2009-253050 | 10/2009 |
| JP | 2011-049073 | 3/2011 |
| JP | 2012-164727 | 8/2012 |
| JP | 2012-164917 | 8/2012 |
| JP | 2012-181381 | 9/2012 |
| JP | 2013-518406 | 5/2013 |
| JP | 2013-146143 | 7/2013 |
| JP | 2014-207391 | 10/2014 |
| WO | WO2014/017184 A1 | 1/2014 |
| WO | 2014/105970 A1 | 7/2014 |

OTHER PUBLICATIONS

Yuguang W. et al. "Influence of nanostructure on electrical and mechanical properties for Cu implanted PET" Surface and Coatings Technology, 2001, vol. 148, No. 2-3, pp. 221-225.

Ozcam A. E. et al. "Effect of ultraviolet/ozone treatment on the surface and bulk properties of poly(dimethyl siloxane) and poly(vinylmethyl siloxane) networks" Polymer, 2014, vol. 55, No. 14, pp. 3107-3119.

International Search Report dated Jan. 19, 2016 for counterpart International Patent Application No. PCT/JP2015/005409 filed Oct. 27, 2015.

Examination Report dated Oct. 28, 2019 in Indian Patent Application No. 201737016221, 6 pages.

Japanese Office Action dated Sep. 17, 2019 in Japanese Patent Application No. 2015-178644, 3 pages.

* cited by examiner

ELEMENT AND ELECTRIC POWER GENERATOR

TECHNICAL FIELD

The present invention relates to an element and an electric power generator.

BACKGROUND ART

Conventionally, there have been attempts to effectively utilize energy from vibration of structures such as a road, a bridge, and architecture, vibration of vehicles such as an automobile and a railway vehicle, and vibration from human exercise. An example of a method for effectively utilizing energy from vibration includes a method of converting vibration energy to electrical energy. Examples of thereof include a method utilizing a piezoelectric element and a method utilizing electrostatic induction.

The method utilizing a piezoelectric element mainly uses a ceramic-based piezoelectric element, and utilizes a phenomenon in which charges are induced on a surface of the piezoelectric element when vibration applies distortion to the piezoelectric element.

The method utilizing electrostatic induction generally uses an electret dielectric which has an electrical charge semipermanently (e.g., see PTLs 1 to 3). The electret dielectric used in the method is a material which allows a dielectric to be charged to thereby generate an electrostatic field semipermanently. The electrical charge is electrostatically induced on an electrode by changing a relative position between the electret dielectric and the electrode arranged apart from the electret dielectric through, for example, vibration. Thus, electric power is generated.

CITATION LIST

Patent Literature

[PTL 1]
Japanese Patent Application Laid-Open (JP-A) No. 2009-253050
[PTL 2]
JP-A No. 2012-164727
[PTL 3]
JP-A No. 2012-164917

SUMMARY OF INVENTION

Technical Problem

The method utilizing a piezoelectric element mainly uses the ceramic-based piezoelectric element, leading to a problem that it does not have flexibility and is fragile.

The method utilizing electrostatic induction requires to charge the dielectric when the electret derivative is produced. An example of a method for charging the dielectric includes a corona discharge and a plasma treatment. Such methods have a problem that much electric power is needed. Further, there is also another problem that a flexible element is difficult to be realized due to insufficient flexibility and a usually equipped mechanically variable capacitance type mechanism.

The present invention aims to solve the above existing problems and achieve the following object. That is, an object of the present invention is to provide an element having flexibility and durability and without the need for a charging treatment.

Solution to Problem

A means for solving the above problems is as follows.

An element, including a first electrode, an intermediate layer, and a second electrode, the first electrode, the intermediate layer, and the second electrode being laminated in this order, wherein the intermediate layer has flexibility, and wherein a deformation amount on a side of the first electrode of the intermediate layer is different from a deformation amount on a side of the second electrode of the intermediate layer when a pressure is applied to the intermediate layer in a direction orthogonal to a surface of the intermediate layer.

Advantageous Effects of Invention

According to the present invention, the above existing problems can be solved and an element having flexibility and durability and without the need for a charging treatment can be provided.

DESCRIPTION OF EMBODIMENTS (Element)

An element of the present invention includes a first electrode, an intermediate layer, and a second electrode which are laminated in this order, and, if necessary, further includes other members.

<First Electrode and Second Electrode>

The material, shape, size, and structure of the first electrode and the second electrode are not particularly limited and may be appropriately selected depending on the intended purpose.

The material, shape, size, and structure of the first electrode may be the same as or different from, but preferably be the same as those of the second electrode.

Examples of the materials of the first electrode and the second electrode include a metal, a carbon-based conductive material, and a conductive rubber composition.

Examples of the metal include gold, silver, copper, aluminium, stainless, tantalum, and nickel.

Example of the carbon-based conductive material includes a carbon nanotube.

Example of the conductive rubber composition includes a composition containing a conductive filler and rubber.

Examples of the conductive filler include a carbon material (e.g., Ketjen black, acetylene black, graphite, carbon fiber (CF), carbon nanofiber (CNF), carbon nanotube (CNT)), a metal filler (e.g., gold, silver, platinum, copper, and aluminium), a conductive polymer material (e.g., a derivative of polythiophene, polyacetylene, polyaniline, polypyrrole, polyparaphenylene, or polyparaphenylenevinylene, or the derivative to which a dopant such as an anion or a cation is added), and an ionic liquid.

Examples of the rubber include a silicone rubber, a modified silicone rubber, an acrylic rubber, a chloroprene rubber, a polysulphide rubber, a urethane rubber, an isobutyl rubber, a fluorosilicone rubber, an ethylene rubber, and a natural rubber (latex).

Example of the shapes of the first electrode and the second electrode includes a thin film.

Example of the structure of the first electrode and the second electrode includes a nonwoven fabric in which fibrous carbon materials described above are laminated on the top of each other.

<Intermediate Layer>

The intermediate layer has flexibility.

The intermediate layer meets at least one of the following conditions (1) and (2).

Condition (1): a deformation amount on a side of the first electrode of the intermediate layer is different from a deformation amount on a side of the second electrode of the intermediate layer when a pressure is applied to the intermediate layer in a direction orthogonal to a surface of the intermediate layer.

Condition (2): a universal hardness (H1) at an indentation depth of 10 μm on a side of the first electrode of the intermediate layer is different from a universal hardness (H2) at an indentation depth of 10 μm on a side of the second electrode of the intermediate layer.

The intermediate layer can achieve much electric power output due to the difference of the deformation amount or the hardness on both sides as described above.

The deformation amount, as used herein, refers to a maximum indentation depth when an indenter is pressed into the intermediate layer under the following conditions.

<Measurement Condition>

Measurement apparatus: micro hardness meter WIN-HUD (manufactured by Fischer)

Indenter: square pyramid diamond indenter with an angle of 136° between opposite faces Initial load: 0.02 mN Maximum load: 1 mN Time for increasing load from initial load to maximum load: 10 seconds The universal hardness is determined as follows.

<Measurement Condition>

Measurement apparatus: micro hardness meter WIN-HUD (manufactured by Fischer)

Indenter: square pyramid diamond indenter with an angle of 136° between opposite faces Indentation depth: 10 μm Initial load: 0.02 mN Maximum load: 100 mN Time for increasing load from initial load to maximum load: 50 seconds A ratio of the universal hardness (H1) to the universal hardness (H2) (H1/H2) is preferably 1.01 or more, more preferably 1.07 or more, particularly preferably 1.13 or more. The upper limit of the ratio (H1/H2) is not particularly limited and may be appropriately selected depending on, for example, the degree of flexibility required during use and a load applied during use, but is preferably 1.70 or less. As used herein, the H1 refers to a universal hardness of a relatively hard surface, and the H2 refers to a universal hardness of a relatively soft surface.

The material of the intermediate layer is not particularly limited and may be appropriately selected depending on the intended purpose. Example thereof includes rubber. Examples of the rubber include a silicone rubber, a fluorosilicone rubber, an acrylic rubber, a chloroprene rubber, a natural rubber (latex), a urethane rubber, a fluororubber, and an ethylenepropylene rubber. Among them, the silicone rubber is preferable.

The intermediate layer may contain a filler for imparting various functional properties thereto. Examples of the filler include titanium oxide, barium titanate, lead zirconate titanate, zinc oxide, silica, calcium carbonate, a carbon material [e.g., carbon black, carbon nanotube, carbon fiber, a fullerene structure-containing compound, and graphene], iron oxide, PTFE, mica, a clay mineral, synthetic hydrotalcite, and a metal. In the case where a piezoelectric filler or a polarized polymer (base material or filler) is used, a polarization treatment is preferably performed.

Examples of the fullerene structure-containing compound include a fullerene, and a fullerene derivative.

Examples of the fullerene include fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene, and fullerene nanotube.

The fullerene derivative means a compound in which a substituent is added to the fullerene. Examples of the substituent include an alkyl group, an aryl group, and a heterocycle group.

The average thickness of the intermediate layer is not particularly limited and may be appropriately selected depending on the intended purpose. However, it is preferably 1 μm to 10 mm, more preferably 50 μm to 200 μm from the viewpoint of deformation followability. When the average thickness falls within the preferable range, a film formation property can be ensured and deformation is not inhibited, leading to good electric power generation.

The intermediate layer has preferably an insulating property. The insulating property means to have a volume resistivity of preferably $10^8$ Ωcm or more, more preferably $10^{10}$ Ωcm or more.

The intermediate layer has a multilayer structure.

<<Surface Modification Treatment and Inactivation Treatment>>

Example of a method for making the deformation amount or the hardness on one side of the intermediate layer be different from that of the other side of the intermediate layer includes a surface modification treatment and an inactivation treatment. The treatments may be performed alone or in combination.

—Surface Modification Treatment—

Examples of the surface modification treatment include a plasma treatment, a corona discharge treatment, an electron beam irradiation treatment, a UV irradiation treatment, an ozone treatment, and a radiation (X ray, α ray, β ray, γ ray, neutron ray) irradiation treatment. Among them, the plasma treatment, the corona discharge treatment, and the electron beam irradiation treatment are preferable from the viewpoint of a treatment speed. However, the surface modification treatment is not limited thereto, as long as it has a certain level of irradiation energy and can modify the material of the surface.

—Plasma Treatment—

In the case of the plasma treatment, a plasma generating device such as a parallel plate-type device, a capacitive coupling-type device, and an inductive coupling-type device as well as an atmospheric pressure plasma device may be used. The plasma treatment is preferably a low pressure plasma treatment from the viewpoint of durability.

A reaction pressure for the plasma treatment is not particularly limited and may be appropriately selected depending on the intended purpose, but is preferably 0.05 Pa to 100 Pa, more preferably 1 Pa to 20 Pa.

A reaction atmosphere for the plasma treatment is not particularly limited and may be appropriately selected depending on the intended purpose. A gas such as an inert gas, a rare gas, or oxygen is effectively used. Argon is preferable from the viewpoint of long lasting effect. The oxygen partial pressure is preferably 5,000 ppm or less. When the oxygen partial pressure in the reaction atmosphere is 5,000 ppm or less, ozone generation can be suppressed to thereby reduce the use of an ozone removing device.

The irradiated electric energy for the plasma treatment is defined as the product of output and irradiation time. The irradiated electric energy is preferably 5 Wh to 200 Wh, more preferably 10 Wh to 50 Wh. When the irradiated electric energy falls within the preferable range, an electric power generating function can be imparted to the intermediate layer and durability is not deteriorated by excessive irradiation.

——Corona Discharge Treatment——

The applied energy (integrated energy) for the corona discharge treatment is preferably 6 J/cm$^2$ to 300 J/cm$^2$, more preferably 12 J/cm$^2$ to 60 J/cm$^2$. When the applied energy falls within the preferable range, an electric power generating function can be imparted to the intermediate layer and durability is not deteriorated by excessive irradiation.

——Electron Beam Irradiation Treatment——

The irradiation dose for the electron beam irradiation treatment is preferably 1 kGy or more, more preferably 300 kGy to 10 MGy. When the irradiation dose falls within the preferable range, an electric power generating function can be imparted to the intermediate layer and durability is not deteriorated by excessive irradiation.

A reaction atmosphere for the electron beam irradiation treatment is not particularly limited and may be appropriately selected depending on the intended purpose. However, the oxygen partial pressure is preferably 5,000 ppm or less by charging an inert gas such as argon, neon, helium, and nitrogen. When the oxygen partial pressure in the reaction atmosphere is 5,000 ppm or less, ozone generation can be suppressed to thereby reduce the use of an ozone removing device.

——UV Irradiation Treatment——

Ultraviolet rays for the UV irradiation treatment have a wavelength of preferably 200 nm to 365 nm, more preferably 240 nm to 320 nm. The integrated light intensity for the UV irradiation treatment is 5 J/cm$^2$ to 500 J/cm$^2$, more preferably 50 J/cm$^2$ to 400 J/cm$^2$. When the integrated light intensity falls within the preferable range, an electric power generating function can be imparted to the intermediate layer and durability is not deteriorated by excessive irradiation.

A reaction atmosphere for the UV irradiation treatment is not particularly limited and may be appropriately selected depending on the intended purpose. However, the oxygen partial pressure is preferably 5,000 ppm or less by charging an inert gas such as argon, neon, helium, and nitrogen. When the oxygen partial pressure in the reaction atmosphere is 5,000 ppm or less, ozone generation can be suppressed to thereby reduce the use of an ozone removing device.

Conventionally, there has been proposed a technology to enhance interlayer adhesion force by forming an active group through excitation or oxidation induced by the plasma treatment, the corona discharge treatment, the UV irradiation treatment, or the electron beam irradiation treatment. However, it has been found that the technology is not preferable since it has a limited application in between layers, and when it is applied on the uppermost surface, releasability is rather deteriorated. Additionally, in the technology, a reactive active group (hydroxyl group) is effectively introduced via a reaction under an oxygen rich state. Therefore, the above technology is essentially different from the surface modification treatment of the present invention.

The surface modification treatment of the present invention is a treatment under an oxygen poor and reduced pressure reaction environment (e.g., plasma treatment), so that re-crosslinking and binding on the surface are facilitated. Therefore, for example, it is believed that durability and releasability are improved due to "increase of the number of Si—O bonds with high binding energy" and "densification through increase of cross-link density," respectively. Note that, some active groups are formed also in the present invention, but the active groups are inactivated by the below-described coupling agent or air dry treatment.

——Inactivation Treatment——

The surface of the intermediate layer may be appropriately subjected to an inactivation treatment using various materials.

The inactivation treatment is not particularly limited and may be appropriately selected depending on the intended purpose, as long as it inactivates the surface of the intermediate layer. Example of thereof includes a treatment in which an inactivating agent is applied onto the surface of the intermediate layer. The inactivation means that surface activity of the intermediate layer is decreased by reacting the inactivating agent with an active group (e.g., —OH) formed through excitation or oxidation induced by the plasma treatment, the corona discharge treatment, the UV irradiation treatment, or the electron beam irradiation treatment to thereby render the surface of the intermediate layer insensitive to any chemical reaction.

Examples of the inactivating agent include an amorphous resin and a coupling agent.

Examples of the amorphous resin includes a resin having perfluoroalkyl polyether in its backbone.

Examples of the coupling agent include metal alkoxide or a metal alkoxide-containing solution. Examples of the metal alkoxide include a compound represented by the following General Formula (1), a partially hydrolyzed polycondensate thereof having a polymerization degree of about 2 to about 10, or a mixture thereof.

General Formula (1)

where $R^1$ and $R^2$ each independently denote a C1-C10 straight or branched chain alkyl group, alkyl polyether chain, or aryl group; and n denotes an integer of 2 to 4.

Specific examples of the compound represented by the General Formula (1) include dimethyl dimethoxy silane, diethyl diethoxy silane, diethyl dimethoxy silane, diethyl diethoxy silane, diphenyl dimethoxy silane, diphenyl diethoxy silane, methyl trimethoxy silane, methyl triethoxy silane, tetramethoxy silane, tetraethoxy silane, and tetrapropoxy silane. From the viewpoint of the durability, tetraethoxy silane is particularly preferable.

In the General Formula (1), $R^1$ may be a fluoroalkyl group; or fluoroalkylacrylate or ether perfluoropolyether to which the fluoroalkyl group is further bonded via an oxygen atom. From the viewpoints of flexibility and durability, a perfluoropolyether group is particularly preferable.

Further examples of the metal alkoxide includes vinyl silanes [e.g., vinyl tris (β-methoxyethoxy) silane, vinyl triethoxy silane, and vinyl trimethoxy silane], acrylic silanes [e.g., γ-methacryloxypropyl trimethoxy silane], epoxy silanes [e.g., β-(3,4-epoxycyclohexyl)ethyl trimethoxysilane, γ-glycidoxypropyl trimethoxysilane, and γ-glycidoxypropylmethyl diethoxysilane], and amino silanes [e.g., N-β (aminoethyl) γ-aminopropyl trimethoxysilane, N-β (aminoethyl) γ-aminopropylmethyl dimethoxysilane, γ-aminopropyl triethoxysilane, and N-phenyl-γ-aminopropyl trimethoxysilane].

In addition to Si atom, Ti, Sn, Al, or Zr may be used alone or in combination as a metal atom in the metal alkoxide.

For example, the inactivation treatment may be performed by impregnating a surface of an intermediate layer precursor (e.g., the rubber described above) with the inactivating agent via coating or dipping, after by the surface modification treatment of the intermediate layer precursor.

In the case where the silicone rubber is used as the intermediate layer precursor, after the surface modification treatment, the inactivation treatment may be performed by standing in air to thereby allow to air dry.

An oxygen concentration profile in a thickness direction of the intermediate layer preferably has a local maximum value.

A carbon concentration profile in a thickness direction of the intermediate layer preferably has a local minimum value.

More preferably, in the intermediate layer, a position at which the oxygen concentration profile takes the local maximum value is the same as a position at which the carbon concentration profile takes the local minimum value.

The oxygen concentration profile and the carbon concentration profile can be determined by X-ray photoelectron spectroscopy (XPS). The measurement may be performed as follows.

<Measurement Method>
Measurement apparatus: ULVAC-PHI QUANTERA SXM (manufactured by ULVAC-PHI, Inc.)
Measurement light source: Al (mono)
Measurement output: 100 μm φ, 25.1 W
Measurement area: 500 μm×300 μm
Pass energy: 55 eV (narrow scan)
Energy step: 0.1 eV (narrow scan)
Relative sensitivity factor: using relative sensitivity factor of PHI
Sputtering source: C60 cluster ion
Ion Gun output: 10 kV, 10 nA
Raster Control: (X=0.5, Y=2.0) mm
Sputtering rate: 0.9 nm/min (in terms of SiO2)

In the XPS, an atomic concentration ratio or an atomic bonding state in a measuring object can be determined by capturing electrons ejected by a photoelectron effect.

Figure 1A:
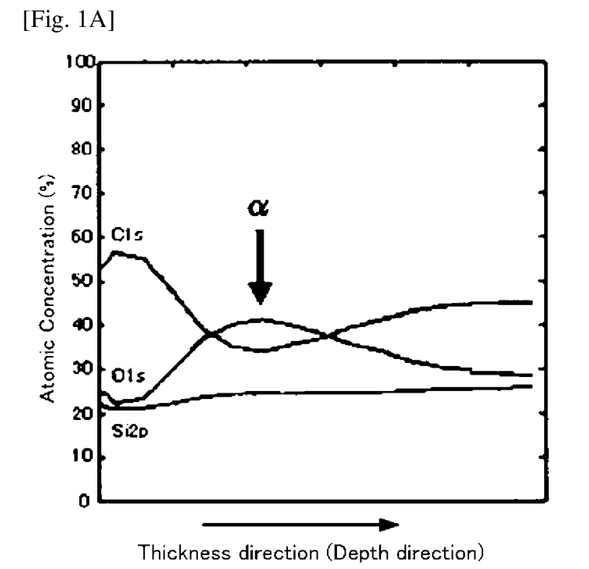
FIG. 1A is a XPS measurement result of an intermediate layer (silicone rubber) with a surface modification treatment and an inactivation treatment.

The silicone rubber has siloxane bonds and contains as its main components Si, O, and C. Therefore, in the case where the silicone rubber is used as the material of the intermediate layer, a wide scan spectrum can be measured by the XPS to thereby determine the atomic concentration ratio (atomic %) of each of elements (Si, O, and C) in a depth direction from a surface layer to inside based on a relative peak intensity ratio of the elements. An example thereof is illustrated in FIG. 1A. FIG. 1A represents a sample of an intermediate layer containing the silicone rubber and treated with the surface modification treatment (plasma treatment) and the inactivation treatment. In FIG. 1A, a horizontal axis represents an analytical depth in a direction from the surface to the inside and a vertical axis represents the atomic concentration ratio.

Figure 1B:
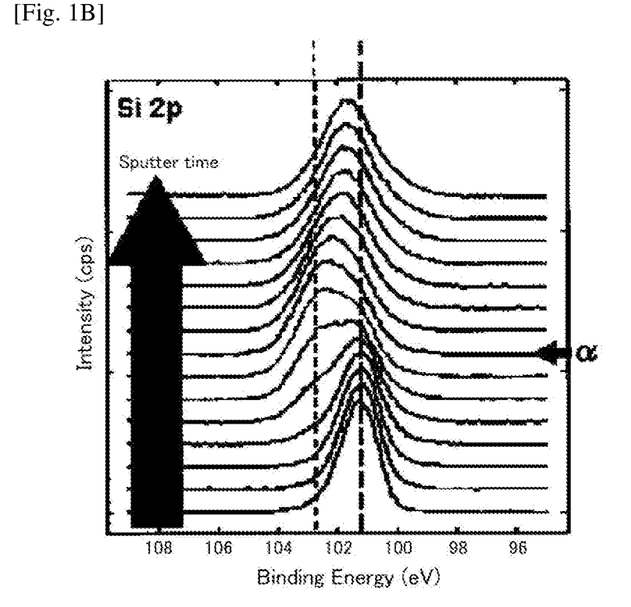
FIG. 1B is a graph representing a change in thickness direction of Si 2p binding energy in the intermediate layer as measured in FIG. 1A.

Additionally, in the case of the silicone rubber, the type and the bonding state of an element bound to Si can be determined by measuring energy of electron ejected from the Si 2p-orbital. Therefore, a peak was resolved from a narrow scan spectrum in the Si 2p-orbital representing the bonding state of Si to thereby determine a chemical bonding state. A result thereof is given in FIG. 1B. A measuring object in FIG. 1B is the sample used in the measurement of FIG. 1A. In FIG. 1B, a horizontal axis represents a binding energy and a vertical axis represents an intensity ratio. A measurement spectrum is represented in the depth (upward) direction.

Generally, it is known that a peak shift amount depends on the bonding state. In the case of the silicone rubber with regard to the present invention, a peak shift towards high energy in the Si 2p-orbital denotes that the number of oxygen atoms bound to Si is increased.

According to the above, when the silicone rubber is subjected to the surface modification treatment and the inactivation treatment, an oxygen concentration is increased from the surface layer to the inside and has the local maximum value; and a carbon concentration is decreased and has the local minimum value. When the oxygen and carbon concentrations are further analyzed in the depth direction, the oxygen concentration is decreased and the carbon concentration is increased. Eventually, the concentrations become equivalent to that of an untreated silicone rubber. The local maximum value of the oxygen concentration detected at the point α in FIG. 1A corresponds to a shift of the Si 2p binding energy towards high energy (α in FIG. 1B), which demonstrates that the increase of the oxygen concentration results from the number of oxygen atoms bound to Si.

Figure 2A:
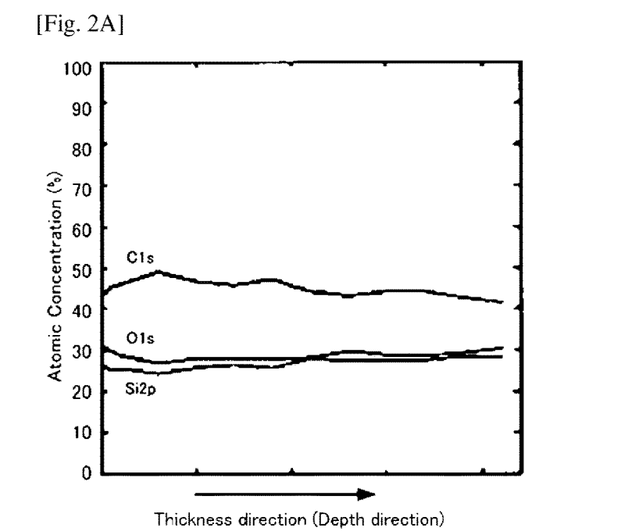
FIG. 2A is a XPS measurement result of an intermediate layer (silicone rubber) without any treatment.
Figure 2B:
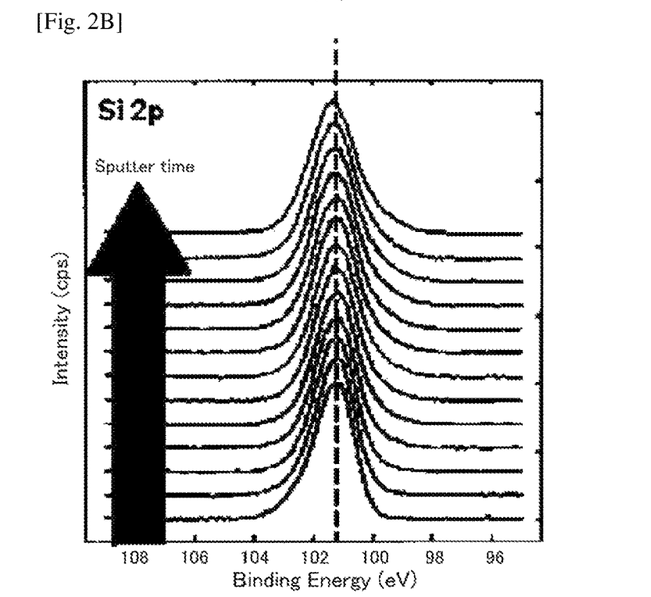
FIG. 2B is a graph representing a change in thickness direction of Si 2p binding energy in the intermediate layer as measured in FIG. 2A.

Note that, FIGS. 2A and 2B illustrate results of an untreated silicone rubber as analyzed in the same manner.

In FIG. 2A, unlike in the case of FIG. 1A, the local maximum value in the oxygen concentration or the local minimum value in the carbon concentration is not observed. Additionally, in FIG. 2B, the Si 2p binding energy is not observed to be shifted towards high energy. Therefore, it is verified that the number of oxygens bound to Si is unchanged.

As described above, the intermediate layer is impregnated with the inactivating agent by applying the inactivating agent (e.g., coupling agent) onto the surface of the intermediate layer or dipping the intermediate layer into the inactivating agent to thereby allow the inactivating agent to permeate into the intermediate layer. In the case where the coupling agent is the compound represented by the General Formula (1), polyorganosiloxane has a concentration distribution in the intermediate layer such that a concentration of oxygen atoms contained in the polyorganosiloxane has the local maximum value in the depth direction. As a result, the intermediate layer contains polyorganosiloxane containing a silicon atom bound to 3 to 4 oxygen atoms.

Note that, the method of the inactivation treatment is not limited to the dipping method. For example, methods such as a plasma CVD, PVD, sputtering, a vacuum vapor deposition, or a combustion chemical vapor deposition may be used, as long as the oxygen atoms contained in the polyorganosiloxane can be distributed such that there is the local maximum value in the depth direction (thickness direction) of the intermediate layer.

The intermediate layer does not have to have an initial surface potential in a stationary state.

Note that, the initial surface potential in the stationary state can be measured under the following measurement conditions. As used herein, no initial surface potential means ±10 V or less as measured under the following measurement conditions.

<Measurement Condition>

Pretreatment: 24 h of standing under temperature of 30° C. and relative humidity of 40% and then 60 sec of discharging (using SJ-F300 manufactured by Keyence)

Apparatus: TRECK MODEL 344
Measurement probe: 6000B-7C
Measurement distance: 2 mm
Measurement spot diameter: diameter ($\Phi$) of 10 mm In the above respect, the element of the present invention is believed to be different from those described in JP-A Nos. 2009-253050, 2014-027756, and 54-14696 in terms of the principle of electric power generation.

Note that, in the element of the present invention, it is presumed that charging in the similar mechanism to friction charging and occurrence of a surface potential difference due to internal charge holding result in uneven electrostatic capacitance because of the difference of the deformation amount based on the difference of hardnesses on both sides of the intermediate layer. Thus, the charge is transferred to thereby generate electric power. However, the correct mechanism is unknown.

The element preferably has a space between the intermediate layer and the first electrode and/or the second electrode, which can increase the electric power output. A method for providing the space is not particularly limited and may be appropriately selected depending on the intended purpose. Example thereof includes a method in which a spacer is arranged between the intermediate layer and the first electrode and/or the second electrode.

Figure 3:
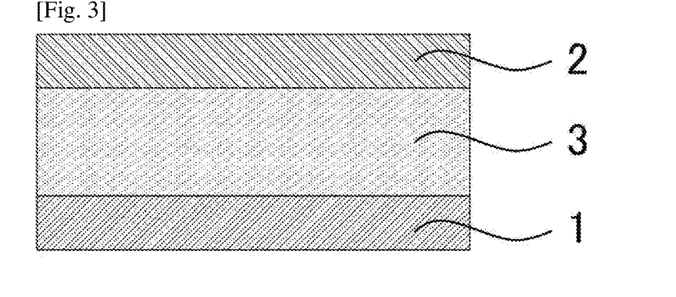
FIG. 3 is a schematic cross-sectional drawing of one exemplary element of the present invention.

One exemplary element of the present invention is schematically illustrated. FIG. 3 is a schematic cross-sectional drawing of an element of the present invention. The element illustrated in FIG. 3 includes a first electrode 1, a second electrode 2, and an intermediate layer 3 arranged between the first electrode 1 and the second electrode 2.

(Electric Power Generator)

An electric power generator of the present invention includes the element of the present invention, and, if necessary, further includes other members.

<Other Members>

Example of the other members includes an electric circuit.

<<Electric Circuit>>

The electric circuit is not particularly limited and may be appropriately selected depending on the intended purpose, as long as it is a circuit for extracting electric power generated in the element.

An electric power generator using the element is suitable for various sensors such as an ultrasonic sensor, a pressure sensor, a tactile sensor, a strain sensor, an acceleration sensor, an impact sensor, a vibration sensor, a pressure sensitive sensor, an electric field sensor, and a sound pressure sensor, in particular, a wearable sensor due to no need for high voltage. Additionally, the electric power generator is also suitable as a piezoelectric film with excellent processability for a headphone, a speaker, a microphone, a hydrophone, a display, a fan, a pump, a variable focus mirror, an ultrasonic transducer, a piezoelectric transformer, a sound insulation material, a soundproofing material, an actuator, and a keyboard. Further, the electric power generator can also be utilized in audio equipment, a data processing device, a measuring device, a medical device, as well as a damping material (damper) used for a vehicle, architecture, or sporting goods (e.g., skiing equipment and a racket) and other fields.

Additionally, the electric power generator is also suitable for the following applications.

electric power generation utilizing natural energy (e.g., wave power, water power, and wind power)

electric power generation from human walking utilizing the generator embedded in shoes, a cloth, a floor, or an accessory.

electric power generation using vibration from traveling of an automobile in which the generator is embedded in its tire.

Also, in the case where the generator is formed on a flexible substrate, it can be expected to be applied to a planar electric power generating body, or a secondary battery which is charged by applying voltage in contrast, and a novel actuator (artificial muscle).

EXAMPLES

Examples of the present invention now will be described below, but the present invention is not limited thereto. Unless otherwise explicitly stated, "part" represents "part by mass". Unless otherwise explicitly stated, "%" represents "% by mass".

Example 1

<Production of Element>
<<First Electrode and Second Electrode>>

An aluminium sheet having an average thickness of 12 μm (manufactured by Mitsubishi Aluminum Company, Ltd.) was used as a first electrode and a second electrode.

<<Production of Intermediate Layer>>
—Intermediate Layer Precursor—

One hundred parts of silicone rubber (TSE3033: manufactured by Momentive Performance Materials Inc.) serving as a base material was mixed with 40 parts of barium titanate (93-5640: manufactured by Wako Pure Chemical Industries, Ltd.) serving as an additive. The resultant mixture was applied onto a PET (polyethylene terephthalate) film by blade coating so as to have an average thickness of 150±20 μm and a dimension of 50 mm×70 mm, to thereby obtain an intermediate layer precursor.

—Surface Modification Treatment—

The intermediate layer precursor was fired at about 120° C. for 30 min, and then subjected to a plasma treatment under the following conditions.

<Plasma Treatment Condition>

Apparatus: PR-500 (manufactured by Yamato Scientific Co., Ltd.)
Output: 100 W
Treatment time: 4 min
Reaction atmosphere: Argon 99.999%
Reaction pressure: 10 Pa —Inactivation Treatment—

Additionally, after the surface modification treatment, a 0.1% solution of a fluorocarbon compound OPTOOL DSX (manufactured by DAIKIN INDUSTRIES, LTD) in perfluorohexane was applied onto a surface-modified surface of the intermediate layer precursor by a dipping (Dip) method at the withdrawal rate of 10 mm/min. Thereafter, the resultant was held for 30 min or longer under an environment of a relative humidity of 90% and a temperature of 60° C. and then dried at 50° C. for 10 min. Thus, an inactivation treatment was performed.

Then, the PET film was peeled off.

Thus, an intermediate layer was obtained.

The intermediate layer was sandwiched between the first electrode and the second electrode to thereby obtain an element. Note that, a 5 mm wide strip of the conductive fabric tape (E05R1020: manufactured by SEIWA ELECTRIC MFG. CO., LTD) was attached to an edge of a surface of the first electrode facing the intermediate layer to thereby provide the surface of the first electrode with concavity and convexity so that there was a gap (air) between the first electrode and the intermediate layer. The gap had the thickness corresponding to that of the conductive fabric tape (about 0.12 mm), but could be varied depending on a vertical load.

<Evaluation>
<<Hardness>>

Universal hardnesses on both sides of the intermediate layer were measured under the following conditions. Results are given in Table 1-1-2.

<Measurement Condition>

Measurement apparatus: micro hardness meter WIN-HUD (manufactured by Fischer)

Indenter: square pyramid diamond indenter with an angle of 136° between opposite faces Indentation depth: 10 μm Initial load: 0.02 mN Maximum load: 100 mN Time for increasing load from initial load to maximum load: 50 seconds <<Deformation Amount>>

Deformation amounts on both sides of the intermediate layer were measured under the following measurement conditions. Results are given in Table 1-1-2.

<Measurement Condition>

Measurement apparatus: micro hardness meter WIN-HUD (manufactured by Fischer)

Indenter: square pyramid diamond indenter with an angle of 136° between opposite faces Initial load: 0.02 mN Maximum load: 1 mN Time for increasing load from initial load to maximum load: 10 seconds <<Measurement of Initial Surface Potential in Stationary State>>

An initial surface potential in a stationary state was measured under the following conditions. Results are given in Table 1-1-2.

<Measurement Condition>

Pretreatment: 24 h of standing under temperature of 30° C. and relative humidity of 40% and then 60 sec of discharging (using SJ-F300 manufactured by Keyence)

Apparatus: TRECK MODEL 344

Measurement probe: 6000B-7C

Measurement distance: 2 mm

Measurement spot diameter: diameter (Φ) of 10 mm

<<XPS Measurement>>

The intermediate layer was subjected to X-ray photoelectron spectroscopy (XPS) to thereby determine an oxygen concentration profile and a carbon concentration profile in a thickness direction of the intermediate layer. Measurements were performed under the following conditions. Results are given in Table 1-1-3.

<Measurement Method>

Measurement apparatus: ULVAC-PHI QUANTERA SXM (manufactured by ULVAC-PHI, Inc.)

Measurement light source: Al (mono)

Measurement output: 100 μm ϕ, 25.1 W

Measurement area: 500 μm×300 μm

Pass energy: 55 eV (narrow scan)

Energy step: 0.1 eV (narrow scan)

Relative sensitivity factor: using relative sensitivity factor of PHI

Sputtering source: C60 cluster ion

Ion Gun output: 10 kV, 10 nA

Raster Control: (X=0.5, Y=2.0) mm

Sputtering rate: 0.9 nm/min (in terms of $SiO_2$)

<<Electric Power Output>>

The first electrode and the second electrode in the resultant element were connected to an electric wire. Then, the whole thereof was sealed with cellophane tape (No. 405, wide: 50 mm, manufactured by Nichiban Co., Ltd.) to thereby obtain an evaluation sample.

Iron ball (weight: 200 g) was fell from a height of 10 cm onto the evaluation sample. At that time, a peak voltage generated between the electrodes was measured with an oscilloscope. Measurements were performed 5 times to thereby calculate an average value, which was determined as a measurement value. It was determined how many times as large as the below described measurement value of Comparative Example 1 the measurement value is. The resultant value was evaluated according to the following evaluation criteria. Results are given in Table 1-1-3.

<Evaluation Criteria>

A: The measurement value is 10 times or more as large as that of Comparative Example 1.

B: The measurement value is 5 times or more but less than 10 times as large as that of Comparative Example 1.

C: The measurement value is less than 5 times as large as that of Comparative Example 1.

Example 2

<Production of Element>

The element was produced in the same manner as in Example 1, except that the reaction atmosphere used for the surface modification treatment was changed to nitrogen.

<Evaluation>

The resultant element was evaluated in the same manner as in Example 1. Results are given in Tables 1-1-2 to 1-1-3.

Example 3

<Production of Element>

The element was produced in the same manner as in Example 1, except that the reaction atmosphere used for the surface modification treatment was changed to oxygen.

<Evaluation>

The resultant element was evaluated in the same manner as in Example 1. Results are given in Tables 1-1-2 to 1-1-3.

Example 4

<Production of Element>

The element was produced in the same manner as in Example 1, except that the surface modification treatment was changed to a corona discharge treatment under the following conditions.

<Corona Discharge Treatment Condition>
Applied voltage: 100 V
Integrated energy: 30 J/cm$^2$
Reaction atmosphere: air
<Evaluation>
The resultant element was evaluated in the same manner as in Example 1. Results are given in Tables 1-1-2 to 1-1-3.

Example 5

<Production of Element>
The element was produced in the same manner as in Example 1, except that the surface modification treatment was changed to a UV irradiation treatment under the following conditions.
<UV Irradiation Treatment Condition>
UV irradiation lamp: VL-215.0 (manufactured by Vilber Lourmat)
Wavelength: 254 nm
Integrated light intensity: 300 J/cm$^2$
Reaction atmosphere: nitrogen (oxygen partial pressure: 5,000 ppm or less)
<Evaluation>
The resultant element was evaluated in the same manner as in Example 1. Results are given in Tables 1-1-2 to 1-1-3.

Example 6

<Production of Element>
The element was produced in the same manner as in Example 1, except that the surface modification treatment was changed to an electron beam irradiation treatment under the following conditions.
<Electron Beam Irradiation Treatment Condition>
Apparatus: line-type low energy electron beam irradiation source (manufactured by Hamamatsu Photonics K.K.)
Irradiation dose: 1 MGy
Reaction atmosphere: nitrogen (oxygen partial pressure: 5,000 ppm or less)
<Evaluation>
The resultant element was evaluated in the same manner as in Example 1. Results are given in Tables 1-1-2 to 1-1-3.

Example 7

<Production of Element>
The element was produced in the same manner as in Example 1, except that, in the inactivation treatment, the OPTOOL DSX solution was changed to tetraethoxysilane (TEOS, tetraethylorthosilicate, manufactured by Wako Pure Chemical Industries, Ltd.).
<Evaluation>
The resultant element was evaluated in the same manner as in Example 1. Results are given in Tables 1-1-2 to 1-1-3.

Example 8

<Production of Element>
The element was produced in the same manner as in Example 1, except that, in the inactivation treatment, the OPTOOL DSX solution was changed to a 50% solution of titanium isopropoxide (TTIP, manufactured by Kojundo Chemical Laboratory Co., Ltd.) in ethanol.
<Evaluation>
The resultant element was evaluated in the same manner as in Example 1. Results are given in Tables 1-1-2 to 1-1-3.

Example 9

<Production of Element>
The element was produced in the same manner as in Example 1, except that, in the inactivation treatment, the OPTOOL DSX solution was changed to a 50% solution of dimethyldimethoxysilane KBM-22 (manufactured by Shin-Etsu Silicones) in ethanol.
<Evaluation>
The resultant element was evaluated in the same manner as in Example 1. Results are given in Tables 1-1-2 to 1-1-3.

Example 10

<Production of Element>
The element was produced in the same manner as in Example 1, except that air-drying was performed for 5 hours under an environment of a temperature of 30° C. and a relative humidity of 70% instead of the inactivation treatment.
<Evaluation>
The resultant element was evaluated in the same manner as in Example 1. Results are given in Tables 1-1-2 to 1-1-3.

Example 11

<Production of Element>
The element was produced in the same manner as in Example 6, except that air-drying was performed for 5 hours under an environment of a temperature of 30° C. and a relative humidity of 70% instead of the inactivation treatment.
<Evaluation>
The resultant element was evaluated in the same manner as in Example 1. Results are given in Tables 1-1-2 to 1-1-3.

Example 12

<Production of Element>
The element was produced in the same manner as in Example 1, except that no space was provided.
<Evaluation>
The resultant element was evaluated in the same manner as in Example 1. Results are given in Tables 1-1-2 to 1-1-3.

Example 13

<Production of Element>
The element was produced in the same manner as in Example 1, except that, in Production of intermediate layer, an amount of the additive to be mixed with 100 parts of the base material was changed to 20 parts.
<Evaluation>
The resultant element was evaluated in the same manner as in Example 1. Results are given in Tables 1-1-2 to 1-1-3.

Example 14

<Production of Element>
The element was produced in the same manner as in Example 1, except that, in Production of intermediate layer, an amount of the additive to be mixed with 100 parts of the base material was changed to 80 parts.
<Evaluation>
The resultant element was evaluated in the same manner as in Example 1. Results are given in Tables 1-1-2 to 1-1-3.

Example 15

<Production of Element>

The element was produced in the same manner as in Example 1, except that, in Production of intermediate layer, no additive was mixed with the base material.

<Evaluation>

The resultant element was evaluated in the same manner as in Example 1. Results are given in Tables 1-1-2 to 1-1-3.

Example 16

<Production of Element>

The element was produced in the same manner as in Example 15, except that air-drying was performed for 5 hours under an environment of a temperature of 30° C. and a relative humidity of 70% instead of the inactivation treatment.

<Evaluation>

The resultant element was evaluated in the same manner as in Example 1. Results are given in Tables 1-1-2 to 1-1-3.

Example 17

<Production of Element>

The element was produced in the same manner as in Example 16, except that the surface modification treatment was changed to an electron beam irradiation treatment under the following conditions.

<Electron Beam Irradiation Treatment Condition>

Apparatus: line-type low energy electron beam irradiation source (manufactured by Hamamatsu Photonics K.K.)

Irradiation dose: 1 MGy

Reaction atmosphere: nitrogen (oxygen partial pressure: 5,000 ppm or less)

<Evaluation>

The resultant element was evaluated in the same manner as in Example 1. Results are given in Tables 1-1-2 to 1-1-3.

Example 18

<Production of Element>

One hundred parts of silicone rubber (TSE3033: manufactured by Momentive Performance Materials Inc.) serving as a base material was mixed with 40 parts of barium titanate serving as an additive. The resultant mixture was applied onto a PET film, which had been formed so as to have a carbon fiber (XN-100-05M, manufactured by Nippon Graphite Fiber Corporation) having an average thickness of 20 µm or less thereon, by blade coating so as to have an average thickness of 150±20 µm and a dimension of 50 mm×70 mm, to thereby obtain an intermediate layer precursor. Then, the carbon fiber (XN-100-05M, manufactured by Nippon Graphite Fiber Corporation) was applied onto a surface of the intermediate layer precursor so as to have the average thickness of 20 µm or less. Then, the resultant was heated at 120° C. for 30 min. Then, one side of the intermediate layer precursor was subjected to the electron beam irradiation treatment under the following conditions. Thus, an element was obtained.

<Electron Beam Irradiation Treatment Condition>

Apparatus: line-type low energy electron beam irradiation source (manufactured by Hamamatsu Photonics K.K.)

Irradiation dose: 1 MGy

Reaction atmosphere: nitrogen (oxygen partial pressure: 5,000 ppm or less)

<Evaluation>

The resultant element was evaluated in the same manner as in Example 1. Results are given in Tables 1-1-2 to 1-1-3.

Example 19

<Production of Element>

The element was produced in the same manner as in Example 1, except that the inactivation treatment was not performed and the following first electrode and second electrode were used.

<<First Electrode and Second Electrode>>

A sheet having the average thickness of 50 µm in which 5% of CNT (carbon nanotube, VGCF-H, manufactured by Showa Denko K.K.) was incorporated into silicone rubber (DY35-2083, manufactured by Toray Industries, Inc.) was used as the first electrode and second electrode.

<Evaluation>

The resultant element was evaluated in the same manner as in Example 1. Results are given in Tables 1-1-2 to 1-1-3.

Example 20

<Production of Element>

The element was produced in the same manner as in Example 1, except that the inactivation treatment was not performed and the following first electrode and second electrode were used.

<<First Electrode and Second Electrode>>

A sheet having the average thickness of 50 µm in which 10% of CNT (carbon nanotube, VGCF-H, manufactured by Showa Denko K.K.) was incorporated into silicone rubber (DY35-2083, manufactured by Toray Industries, Inc.) was used as the first electrode and second electrode.

<Evaluation>

The resultant element was evaluated in the same manner as in Example 1. Results are given in Tables 1-1-2 to 1-1-3.

Examples 21 to 27

<Production of Element>

The element was produced in the same manner as in Example 1, except that, in Production of intermediate layer, the additive was changed to any of the following additives.

<Additive>

Example 21 titanium oxide (CR-90, manufactured by ISHIHARA SANGYO KAISHA, LTD.)

Example 22 silica (R972, manufactured by NIPPON AEROSIL CO., LTD.)

Example 23 melamine (EPOSTAR S12, manufactured by NIPPON SHOKUBAI CO., LTD.)

Example 24 synthetic hydrotalcite (DHT-4A, manufactured by Kyowa Chemical Industry Co., Ltd.)

Example 25 red iron oxide (100ED, manufactured by TODA KOGYO CORP.)

Example 26

PTFE (KTL-8N, manufactured by KITAMURA LIMITED)

Example 27 fullerene (NANOM PURPLE ST, manufactured by Frontier Carbon Corporation)
<Evaluation>
The resultant element was evaluated in the same manner as in Example 1. Results are given in Tables 1-1-2 to 1-1-3.

Examples 28 to 30

<Production of Element>
The element was produced in the same manner as in Example 1, except that, in Production of intermediate layer, the base material was changed to any of the following base materials.
<Base Material>

Example 28 fluorosilicone rubber (X36-420U, manufactured by Shin-Etsu Chemical Co., Ltd.)

Example 29 urethane rubber (ADAPT 60L, manufactured by NISSIN RESIN Co., Ltd.)

Example 30 acrylic rubber (NIPOL AR51, manufactured by ZEON CORPORATION)
<Evaluation>
The resultant element was evaluated in the same manner as in Example 1. Results are given in Tables 1-1-2 to 1-1-3.

Example 31

<Element>
The element produced in Example 1 was used.
<Evaluation>
Two opposite electrodes of the element produced in Example 1 were connected to electrodes of a function generator (FG-274; manufactured by TEXIO TECHNOLOGY CORPORATION) so as to have different polarities, followed by applying a voltage thereto. The audibility of sound was determined at a position 1 m away therefrom. If sound was audible at all frequencies, it was determined as the passing grade. Results are given in Table 1-3.
<Application Condition>
CMOS output ±5 V
Square wave (Duty ratio 50%)
Frequency: 400 Hz, 2 kHz, 12 kHz

Comparative Example 1

<Production of Element>
The element was produced in the same manner as in Example 1, except that neither the surface modification treatment nor the inactivation treatment was performed.
<Evaluation>
The resultant element was evaluated in the same manner as in Example 1. Result are given in Tables 1-2-2 to 1-2-3.

Comparative Example 2

<Production of Element>
The element was produced in the same manner as in Example 9, except that the surface modification treatment was not performed.
<Evaluation>
The resultant element was evaluated in the same manner as in Example 1. Result are given in Tables 1-2-2 to 1-2-3.

Comparative Examples 3 to 15

<Production of Element>
The element was produced in the same manner as in Comparative Example 1, except that, in Production of intermediate layer, the base material and the additive were changed to base materials and additives presented in Table 1-2-1.
<Evaluation>
The resultant element was evaluated in the same manner as in Example 1. Result are given in Tables 1-2-2 to 1-2-3.

Comparative Example 16

<Production of Element>
The element was produced in the same manner as in Comparative Example 1, except that a piezo film sheet (3-1004346-0: 100 μm, manufactured by Tokyo Sensor Co., Ltd.) was used as an intermediate layer.
<Evaluation>
The resultant element was evaluated in the same manner as in Example 1. Result are given in Tables 1-2-2 to 1-2-3.

Comparative Example 17

<Production of Element>
CYTOP (CTL-809A; manufactured by ASAHI GLASS CO., LTD.) was spin-coated onto a bottom metal electrode, followed by standing at room temperature for 30 min, and being subjected to a precure at 50° C. for 1 hour and a postcure at 300° C. for 1 hour in an oven to thereby obtain a sample having a coating thickness of about 10 μm.

Thereafter, the resultant sample was subjected to corona discharge to thereby allow it to charge under the following conditions.

A corona charging device was provided with a corona needle and an electrode which were arranged to be opposed to each other, and a grid which was arranged between the corona needle and the electrode. A corona discharge was able to be performed by a high-voltage DC power supply (HAR-20R5; manufactured by Matsusada Precision Inc.). A power supply for grid was able to apply a voltage to the grid.

The element was produced in the same manner as in Comparative Example 1, except that an intermediate layer produced by charging a thin film (converting a thin film to an electret) using the device while heating on a hotplate under the following conditions was used.

<Charging Condition>
Corona needle voltage: −10 kV
Grid voltage: −1 kV
Plate temperature: 100° C.
<Evaluation>
The resultant element was evaluated in the same manner as in Example 1. Result are given in Tables 1-2-2 to 1-2-3.

Comparative Example 18

<Production of Element>
The element was produced in the same manner as in Example 1, except that neither the surface modification treatment nor the inactivation treatment was performed.
<Evaluation>
The resultant element was evaluated in the same manner as in Example 31. Result are given in Table 1-3.

TABLE 1-1-1

|  | Intermediate layer | | | | | |
|---|---|---|---|---|---|---|
|  | Base material | Additive Type | Surface modification treatment | | Inactivation treatment | |
|  | (100 parts by mass) | (parts by mass) | Method | Reaction gas | Method | Material |
| Ex. 1 | Silicone rubber | Barium titanate (40) | Plasma treatment | Ar | Dip | OPTOOL DSX |
| Ex. 2 | | | | Nitrogen | | |
| Ex. 3 | | | | Oxygen | | |
| Ex. 4 | | | Corona discharge | Air | | |
| Ex. 5 | | | UV irradiation | Nitrogen | | |
| Ex. 6 | | | Electron beam irradiation | Nitrogen | | |
| Ex. 7 | | | Plasma treatment | Ar | | TEOS |
| Ex. 8 | | | | | | TTIP |
| Ex. 9 | | | | | | KBM-22 |
| Ex. 10 | | | | | No | No |
| Ex. 11 | | | Electron beam irradiation | Nitrogen | | |
| Ex. 12 | | | Plasma treatment | Ar | Dip | OPTOOL DSX |
| Ex. 13 | | Barium titanate (20) | | | | |
| Ex. 14 | | Barium titanate (80) | | | | |
| Ex. 15 | | — | | | | |
| Ex. 16 | | | | | No | No |
| Ex. 17 | | | Electron beam irradiation | Nitrogen | | |
| Ex. 18 | | Barium titanate (40) | | | | |
| Ex. 19 | | | Plasma treatment | Ar | Dip | OPTOOL DSX |
| Ex. 20 | | | | | | |
| Ex. 21 | | Titanium oxide (40) | | | | |
| Ex. 22 | | Silica (40) | | | | |
| Ex. 23 | | Melamine (40) | | | | |
| Ex. 24 | | Synthetic hydrotalcite (40) | | | | |
| Ex. 25 | | Red iron oxide (1.0) | | | | |
| Ex. 26 | | PTFE (40) | | | | |
| Ex. 27 | | Fullerene (0.1) | | | | |
| Ex. 28 | Fluorosilicone rubber | Barium titanate (40) | | | | |
| Ex. 29 | Urethane rubber | | | | | |
| Ex. 30 | Acrylic rubber | | | | | |

TABLE 1-1-2

| | Intermediate layer | | | | | |
|---|---|---|---|---|---|---|
| | Universal hardness | | | Deformation amount | | |
| | Hardness of high hardness portion (N/mm$^2$) | Hardness of low hardness portion (N/mm$^2$) | Hardness ratio | Surface opposed to first electrode (μm) | Surface opposed to second electrode (μm) | Initial surface potential (V) |
| Ex. 1 | 0.53 | 0.41 | 1.29 | 4.3 | 7.2 | 2 |
| Ex. 2 | 0.53 | 0.42 | 1.26 | 4.2 | 7.2 | 5 |
| Ex. 3 | 0.54 | 0.41 | 1.32 | 4.1 | 7.2 | −2 |

TABLE 1-1-2-continued

| | Intermediate layer | | | | | |
|---|---|---|---|---|---|---|
| | Universal hardness | | | Deformation amount | | |
| | Hardness of high hardness portion (N/mm$^2$) | Hardness of low hardness portion (N/mm$^2$) | Hardness ratio | Surface opposed to first electrode (μm) | Surface opposed to second electrode (μm) | Initial surface potential (V) |
| Ex. 4  | 0.53  | 0.41  | 1.29 | 4.5 | 7.2 | −4 |
| Ex. 5  | 0.45  | 0.42  | 1.07 | 4.6 | 7.1 | 4 |
| Ex. 6  | 0.60  | 0.41  | 1.46 | 3.2 | 7.2 | 6 |
| Ex. 7  | 0.44  | 0.41  | 1.07 | 4.6 | 7.1 | 3 |
| Ex. 8  | 0.43  | 0.41  | 1.05 | 4.2 | 7.2 | 2 |
| Ex. 9  | 0.43  | 0.41  | 1.05 | 4.7 | 7.2 | 1 |
| Ex. 10 | 0.44  | 0.41  | 1.07 | 4.3 | 7.2 | −5 |
| Ex. 11 | 0.52  | 0.41  | 1.27 | 3.4 | 7.2 | 0 |
| Ex. 12 | 0.44  | 0.40  | 1.10 | 4.7 | 7.1 | 4 |
| Ex. 13 | 0.36  | 0.32  | 1.13 | 5.5 | 8.6 | −3 |
| Ex. 14 | 0.59  | 0.56  | 1.05 | 3.2 | 4.3 | 5 |
| Ex. 15 | 0.36  | 0.32  | 1.13 | 8.4 | 9.0 | −4 |
| Ex. 16 | 0.330 | 0.328 | 1.01 | 7.0 | 9.0 | 6 |
| Ex. 17 | 0.52  | 0.32  | 1.63 | 6.0 | 9.0 | 8 |
| Ex. 18 | 0.61  | 0.40  | 1.53 | 3.4 | 7.2 | −4 |
| Ex. 19 | 0.44  | 0.40  | 1.10 | 5.9 | 7.1 | 1 |
| Ex. 20 | 0.43  | 0.40  | 1.08 | 5.6 | 7.2 | 2 |
| Ex. 21 | 0.45  | 0.39  | 1.15 | 5.4 | 8.1 | −3 |
| Ex. 22 | 0.45  | 0.42  | 1.07 | 5.3 | 6.8 | 4 |
| Ex. 23 | 0.34  | 0.30  | 1.13 | 7.2 | 8.7 | 5 |
| Ex. 24 | 0.46  | 0.40  | 1.15 | 5.5 | 7.0 | 6 |
| Ex. 25 | 0.36  | 0.34  | 1.06 | 7.0 | 8.1 | 8 |
| Ex. 26 | 0.37  | 0.35  | 1.06 | 7.1 | 8.5 | 9 |
| Ex. 27 | 0.36  | 0.34  | 1.06 | 7.0 | 8.1 | 7 |
| Ex. 28 | 0.94  | 0.90  | 1.04 | 1.3 | 3.0 | −1 |
| Ex. 29 | 1.06  | 0.98  | 1.08 | 1.2 | 2.8 | 2 |
| Ex. 30 | 0.68  | 0.64  | 1.06 | 3.4 | 5.2 | 4 |

TABLE 1-1-3

| | Intermediate layer XPS depth evaluation | | | Electrode | | | Evaluation result | |
|---|---|---|---|---|---|---|---|---|
| | Oxygen local maximum value Omax | Carbon local minimum value Cmin | Consistency between Omax and Cmin | Main material (additive, % by mass) | Average thickness (μm) | Gap | Generated voltage Peak voltage (times) | Judgement |
| Ex. 1  | Yes | Yes | Yes | Aluminium | 12 | Yes | 16 | A |
| Ex. 2  |     |     |     |           |    |     | 15 | A |
| Ex. 3  |     |     |     |           |    |     | 14 | A |
| Ex. 4  |     |     |     |           |    |     | 10 | A |
| Ex. 5  |     |     |     |           |    |     | 10 | A |
| Ex. 6  |     |     |     |           |    |     | 10 | A |
| Ex. 7  |     |     |     |           |    |     | 12 | A |
| Ex. 8  |     |     |     |           |    |     | 9  | B |
| Ex. 9  |     |     |     |           |    |     | 8  | B |
| Ex. 10 |     |     |     |           |    |     | 8  | B |
| Ex. 11 |     |     |     |           |    |     | 12 | A |
| Ex. 12 |     |     |     |           |    | No  | 8  | B |
| Ex. 13 |     |     |     |           |    | Yes | 14 | A |
| Ex. 14 |     |     |     |           |    |     | 10 | A |
| Ex. 15 |     |     |     |           |    |     | 12 | A |
| Ex. 16 |     |     |     |           |    |     | 8  | B |
| Ex. 17 |     |     |     |           |    |     | 10 | A |
| Ex. 18 |     |     |     | Carbon fiber | 20 or less | No | 7 | B |
| Ex. 19 |     |     |     | Silicone rubber (CNT, 5) | 50 | Yes | 6 | B |
| Ex. 20 |     |     |     | Silicone rubber (CNT, 10) | 12 |     | 5 | B |
| Ex. 21 |     |     |     | Aluminium |    |     | 10 | A |
| Ex. 22 |     |     |     |           |    |     | 9  | B |

TABLE 1-1-3-continued

| | Intermediate layer XPS depth evaluation | | | Electrode | | | Evaluation result | |
|---|---|---|---|---|---|---|---|---|
| | Oxygen local maximum value Omax | Carbon local minimum value Cmin | Consistency between Omax and Cmin | Main material (additive, % by mass) | Average thickness (μm) | Gap | Generated voltage Peak voltage (times) | Judgement |
| Ex. 23 | | | | | | | 7 | B |
| Ex. 24 | | | | | | | 8 | B |
| Ex. 25 | | | | | | | 7 | B |
| Ex. 26 | | | | | | | 6 | B |
| Ex. 27 | | | | | | | 8 | B |
| Ex. 28 | | | | | | | 8 | B |
| Ex. 29 | | | | | | | 7 | B |
| Ex. 30 | | | | | | | 6 | B |

TABLE 1-2-1

| | Intermediate layer | | | | | |
|---|---|---|---|---|---|---|
| | Base material (100 parts by mass) | Additive Type (parts by mass) | Surface modification Method | Reaction gas | Inactivation treatment Method | Material |
| Comp. Ex. 1 | Silicone rubber | Barium titanate (40) | No | No | No | No |
| Comp. Ex. 2 | | | | | Dip | KBM-22 |
| Comp. Ex. 3 | | Barium titanate (20) | | | No | No |
| Comp. Ex. 4 | | Barium titanate (80) | | | | |
| Comp. Ex. 5 | | Titanium (40) | | | | |
| Comp. Ex. 6 | | Silica (40) | | | | |
| Comp. Ex. 7 | | Melamine (40) | | | | |
| Comp. Ex. 8 | | Synthetic hydrotalcite (40) | | | | |
| Comp. Ex. 9 | | Red iron oxide (1.0) | | | | |
| Comp. Ex. 10 | | PTFE (40) | | | | |
| Comp. Ex. 11 | | Fullerene (0.1) | | | | |
| Comp. Ex. 12 | | — | | | | |
| Comp. Ex. 13 | Fluorosilicone rubber | Barium titanate (40) | | | | |
| Comp. Ex. 14 | Urethane rubber | | | | | |
| Comp. Ex. 15 | Acrylic rubber | | | | | |
| Comp. Ex. 16 | PVDF | — | | | | |
| Comp. Ex. 17 | CYTOP | — | | | | |

TABLE 1-2-2

| | Intermediate layer | | | | | |
|---|---|---|---|---|---|---|
| | Universal hardness | | | Deformation amount | | |
| | Hardness of surface opposed to first electrode (N/mm$^2$) | Hardness of surface opposed to second electrode (N/mm$^2$) | Hardness ratio | Surface opposed to first electrode (μm) | Surface opposed to second electrode (μm) | Initial surface potential (V) |
| Comp. Ex. 1 | 0.42 | 0.42 | 1.00 | 6.4 | 6.4 | −1 |
| Comp. Ex. 2 | 0.41 | 0.41 | 1.00 | 7.2 | 7.2 | 2 |

TABLE 1-2-2-continued

| | Intermediate layer | | | | | |
|---|---|---|---|---|---|---|
| | Universal hardness | | | Deformation amount | | |
| | Hardness of surface opposed to first electrode (N/mm²) | Hardness of surface opposed to second electrode (N/mm²) | Hardness ratio | Surface opposed to first electrode (μm) | Surface opposed to second electrode (μm) | Initial surface potential (V) |
| Comp. Ex. 3 | 0.32 | 0.32 | 1.00 | 8.8 | 8.8 | 5 |
| Comp. Ex. 4 | 0.56 | 0.56 | 1.00 | 4.6 | 4.6 | 0 |
| Comp. Ex. 5 | 0.39 | 0.39 | 1.00 | 7.2 | 7.2 | 6 |
| Comp. Ex. 6 | 0.42 | 0.42 | 1.00 | 7.1 | 7.1 | −4 |
| Comp. Ex. 7 | 0.3 | 0.3 | 1.00 | 9.2 | 9.2 | −6 |
| Comp. Ex. 8 | 0.4 | 0.4 | 1.00 | 7.0 | 7.0 | 5 |
| Comp. Ex. 9 | 0.34 | 0.34 | 1.00 | 8.2 | 8.2 | 6 |
| Comp. Ex. 10 | 0.35 | 0.35 | 1.00 | 8.0 | 8.0 | 2 |
| Comp. Ex. 11 | 0.34 | 0.34 | 1.00 | 8.1 | 8.1 | 6 |
| Comp. Ex. 12 | 0.32 | 0.32 | 1.00 | 8.9 | 8.9 | −4 |
| Comp. Ex. 13 | 0.53 | 0.53 | 1.00 | 4.8 | 4.8 | −6 |
| Comp. Ex. 14 | 0.6 | 0.6 | 1.00 | 5.3 | 5.3 | −5 |
| Comp. Ex. 15 | 0.4 | 0.4 | 1.00 | 7.1 | 7.1 | 4 |
| Comp. Ex. 16 | 34 | 34 | 1.00 | 0.6 | 0.6 | 5 |
| Comp. Ex. 17 | Not measured | Not measured | Not measured | Not measured | Not measured | −250 |

TABLE 1-2-3

| | Intermediate layer XPS depth evaluation | | | Electrode | | | Evaluation result | |
|---|---|---|---|---|---|---|---|---|
| | Oxygen local maximum value Omax | Carbon local minimum value Cmin | Consistency between Omax and Cmin | Main material (additive, % by mass) | Average thickness (μm) | Gap | Generated voltage Peak voltage (times) | Judgement |
| Comp. Ex. 1 | No | No | No | Aluminium | 12 | Yes | 1 | C |
| Comp. Ex. 2 | | | | | | | 0.9 | C |
| Comp. Ex. 3 | | | | | | | 0.8 | C |
| Comp. Ex. 4 | | | | | | | 0.6 | C |
| Comp. Ex. 5 | | | | | | | 0.8 | C |
| Comp. Ex. 6 | | | | | | | 0.7 | C |
| Comp. Ex. 7 | | | | | | | 0.5 | C |
| Comp. Ex. 8 | | | | | | | 0.5 | C |
| Comp. Ex. 9 | | | | | | | 0.6 | C |
| Comp. Ex. 10 | | | | | | | 0.3 | C |
| Comp. Ex. 11 | | | | | | | 0.6 | C |
| Comp. Ex. 12 | | | | | | | 0.6 | C |
| Comp. Ex. 13 | | | | | | | 0.8 | C |
| Comp. Ex. 14 | | | | | | | 0.6 | C |
| Comp. Ex. 15 | | | | | | | 0.5 | C |
| Comp. Ex. 16 | | | | Ag | No | No | 1.2 | C |
| Comp. Ex. 17 | | | | Aluminium | 12 | Yes | 3 | C |

Comparative Example 5 titanium oxide (CR-90, manufactured by ISHIHARA SANGYO KAISHA, LTD.)

Comparative Example 6 silica (R972, manufactured by NIPPON AEROSIL CO., LTD.)

Comparative Example 7 melamine (EPOSTAR S12, manufactured by NIPPON SHOKUBAI CO., LTD.)

Comparative Example 8 synthetic hydrotalcite (DHT-4A, manufactured by Kyowa Chemical Industry Co., Ltd.)

Comparative Example 9 red iron oxide (100ED, manufactured by TODA KOGYO CORP.)

Comparative Example 10

PTFE (KTL-8N, manufactured by KITAMURA LIMITED)

Comparative Example 11 fullerene (NANOM PURPLE ST, manufactured by Frontier Carbon Corporation)

Comparative Example 13 fluorosilicone rubber (X36-420U, manufactured by Shin-Etsu Chemical Co., Ltd.)

Comparative Example 14 urethane rubber (ADAPT 60L, manufactured by NISSIN RESIN Co., Ltd.)

Comparative Example 15 acrylic rubber (NIPOL AR51, manufactured by ZEON CORPORATION)

TABLE 1-3

| | Frequency/Hz | | | |
|---|---|---|---|---|
| | 400 | 2,000 | 12,000 | Judgment |
| Example 31 | Audible | Audible | Audible | Pass |
| Comparative Example 18 | Inaudible | Inaudible | Inaudible | Fail |

The followings were revealed from the above results.

As can be seed from Examples 1 to 9 and Comparative Examples 1 and 2, the hardness and thus the deformation amount of the intermediate layer were changed to thereby improve power generation effect by performing the surface modification treatment and the inactivation treatment, that is, by providing the intermediate layer containing polyorganosiloxane which contained a silicon atom bound to 3 to 4 oxygen atoms.

Also, as can be seed from Examples 10, 11, and 16 to 20, even in the case where the inactivation treatment was not performed, the power generation effect was improved in the same manner as in Example 1 as long as the intermediate layer containing polyorganosiloxane which contained a silicon atom bound to 3 to 4 oxygen atoms is formed, although the power generation effect was inferior to Example 1.

Also, as can be seed from Examples 15 to 17, even in the case where the intermediate layer contained no additive, the power generation effect was improved in the same manner as in Example 1 as long as the intermediate layer containing polyorganosiloxane which contained a silicon atom bound to 3 to 4 oxygen atoms, although the power generation effect was inferior to Example 1.

Also, as can be seed from Examples 13, 14, and 21 to 30 and Comparative Examples 3 to 15, even in the case where the types of the base material and the additive, and the amount thereof were changed, the power generation effect was improved in the same manner as in Example 1 as long as the intermediate layer containing polyorganosiloxane which contained a silicon atom bound to 3 to 4 oxygen atoms is formed through the surface modification treatment and the inactivation treatment, although the power generation effect was inferior to Example 1.

Also, as can be seen from Examples 1 and 12, the power generation effect was improved by providing the space between the polyorganosiloxane-containing layer and the electrode opposed thereto.

Also, as compared with Comparative Example 18, Example 31 was operated independent of frequencies when the voltage was applied thereto. Thus, it can be seen that an "inverse piezoelectric effect" is generated by forming the intermediate layer containing polyorganosiloxane which contained a silicon atom bound to 3 to 4 oxygen atoms through the surface modification treatment and the inactivation treatment.

Aspects of the present invention are, for example, as follows.

<1>An element, including:
a first electrode;
an intermediate layer; and
a second electrode,
the first electrode, the intermediate layer, and the second electrode being laminated in this order,
wherein the intermediate layer has flexibility, and
wherein a deformation amount on a side of the first electrode of the intermediate layer is different from a deformation amount on a side of the second electrode of the intermediate layer when a pressure is applied to the intermediate layer in a direction orthogonal to a surface of the intermediate layer.

<2>An element, including:
a first electrode;
an intermediate layer; and
a second electrode,
the first electrode, the intermediate layer, and the second electrode being laminated in this order,
wherein the intermediate layer has flexibility, and
wherein a universal hardness (H1) at an indentation depth of 10 μm on a side of the first electrode of the intermediate layer is different from a universal hardness (H2) at an indentation depth of 10 μm on a side of the second electrode of the intermediate layer.

<3>The element according to <2>, wherein a ratio of the universal hardness (H1) to the universal hardness (H2) (H1/H2) is 1.01 or more.

<4>The element according to any one of <1>to <3>, wherein the intermediate layer includes polyorganosiloxane including a silicon atom bound to 3 to 4 oxygen atoms.

<5>The element according to <4>, wherein an oxygen concentration profile in a thickness direction of the intermediate layer has a local maximum value.

<6>The element according to <4>or <5>, wherein a carbon concentration profile in a thickness direction of the intermediate layer has a local minimum value.

<7>The element according to <6>, wherein, in the intermediate layer, a position at which the oxygen concentration profile takes the local maximum value is same as a position at which the carbon concentration profile takes the local minimum value.

<8>The element according to any one of <1>to <7>, wherein the intermediate layer has no surface potential in a stationary state.

<9>The element according to any one of <1>to <8>, wherein there is a space between the intermediate layer and at least one of the first electrode and the second electrode.

<10>An electric power generator, including:
the element according to any one of <1>to <9>.

REFERENCE SIGNS LIST

1 first electrode
2 second electrode
3 intermediate layer

The invention claimed is:

1. An element, comprising:
a first electrode;
an intermediate layer; and
a second electrode,
the first electrode, the intermediate layer, and the second electrode being laminated in this order,
wherein the intermediate layer has flexibility, and
wherein the intermediate layer has been subjected to a surface modification treatment so that (1) a hardness of a first surface on a side of the first electrode of the intermediate layer is different from a hardness of a second surface on a side of the second electrode of the intermediate layer, and (2) a deformation amount of the first surface on the side of the first electrode of the intermediate layer is different from a deformation amount of the second surface on the side of the second electrode of the intermediate layer when a pressure is applied to the intermediate layer in a direction orthogonal to the first surface of the intermediate layer.

2. An element, comprising:
a first electrode;
an intermediate layer; and
a second electrode,
the first electrode, the intermediate layer, and the second electrode being laminated in this order,
wherein the intermediate layer has flexibility, and
wherein a universal hardness (H1) at an indentation depth of 10 μm on a side of the first electrode of the intermediate layer is different from a universal hardness (H2) at an indentation depth of 10 μm on a side of the second electrode of the intermediate layer.

3. The element according to claim 2, wherein a ratio of the universal hardness (H1) to the universal hardness (H2) (H1/H2) is 1.01 or more.

4. The element according claim 1, wherein the intermediate layer comprises polyorganosiloxane comprising a silicon atom bound to 3 to 4 oxygen atoms.

5. The element according to claim 4, wherein the intermediate layer has been altered by the surface modification treatment so that an oxygen concentration profile in a thickness direction of the intermediate layer has a local maximum value away from the first and second surfaces.

6. The element according to claim 4, wherein the intermediate layer has been altered by the surface modification treatment so that a carbon concentration profile in a thickness direction of the intermediate layer has a local minimum value away from the first and second surfaces.

7. The element according to claim 6, wherein, in the intermediate layer having been altered by the surface modification treatment, a position at which an oxygen concentration profile takes a local maximum value is same as a position at which the carbon concentration profile takes the local minimum value.

8. The element according to claim 1, wherein the intermediate layer has no surface potential in a stationary state.

9. The element according to claim 1, wherein a spacer is arranged between the intermediate layer and at least one of the first electrode and the second electrode.

10. An electric power generator, comprising:
the element according to claim 1.

11. The element according to claim 2, wherein the intermediate layer comprises polyorganosiloxane comprising a silicon atom bound to 3 to 4 oxygen atoms.

12. The element according to claim 11, wherein an oxygen concentration profile in a thickness direction of the intermediate layer has a local maximum value.

13. The element according to claim 11, wherein a carbon concentration profile in a thickness direction of the intermediate layer has a local minimum value.

14. The element according to claim 13, wherein, in the intermediate layer, a position at which an oxygen concentration profile takes a local maximum value is same as a position at which the carbon concentration profile takes the local minimum value.

15. The element according to claim 2, wherein the intermediate layer has no surface potential in a stationary state.

16. The element according to claim 2, wherein a spacer is arranged between the intermediate layer and at least one of the first electrode and the second electrode.

17. An electric power generator, comprising the element according to claim 2.

18. The element of claim 1, wherein the intermediate layer is formed of a material having an atomic concentration whose distribution with thickness of the intermediate layer is altered by a surface modification treatment, wherein the material includes silicon, carbon, and oxygen, and a distribution of the atomic concentration of carbon and oxygen in the thickness direction has been altered by the surface modification treatment to be different than without the surface modification treatment, so that the material is structurally different after the surface modification treatment.

19. The element of claim 2, wherein the intermediate layer is formed of a material having an atomic concentration whose distribution with thickness of the intermediate layer is altered by a surface modification treatment, wherein the material includes silicon, carbon, and oxygen, and a distribution of the atomic concentration of carbon and oxygen in the thickness direction is altered by the surface modification treatment to be different than without the surface modification treatment, so that the material is structurally different after the surface modification treatment.

* * * * *